(12) United States Patent
Aton

(10) Patent No.: US 8,446,175 B2
(45) Date of Patent: May 21, 2013

(54) LOGIC-CELL-COMPATIBLE DECOUPLING CAPACITOR

(75) Inventor: Thomas John Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/976,829

(22) Filed: Feb. 22, 2011

(65) Prior Publication Data

US 2011/0148466 A1    Jun. 23, 2011

Related U.S. Application Data

(60) Provisional application No. 61/289,455, filed on Dec. 23, 2009.

(51) Int. Cl.
*H01L 25/00* (2006.01)
*H03K 19/00* (2006.01)

(52) U.S. Cl.
USPC ............................ 326/103; 326/101; 326/102

(58) Field of Classification Search
None
See application file for complete search history.

(56) References Cited

U.S. PATENT DOCUMENTS

2007/0045770 A1 * 3/2007 Aoki .............................. 257/516
2008/0203436 A1 * 8/2008 Park .............................. 257/203

* cited by examiner

*Primary Examiner* — Anh Tran
(74) *Attorney, Agent, or Firm* — Wade J. Brady, III; Frederick J. Telecky, Jr.

(57) ABSTRACT

An integrated circuit containing CMOS logic gates and a logic-cell-compatible decoupling capacitor adjacent to the logic gates, in which the decoupling capacitor includes p+/n and n+/p capacitors, resistors between 1 and 1000 ohms connecting the capacitors to Vdd and Vss buses, and gate elements which have widths and spacings similar to the adjacent logic gates. A process of forming an integrated circuit containing CMOS logic gates and a logic-cell-compatible decoupling capacitor adjacent to the logic gates, in which the decoupling capacitor includes p+/n and n+/p capacitors, resistors between 1 and 1000 ohms connecting the capacitors to Vdd and Vss buses, and gate elements which have widths and spacings similar to the adjacent logic gates.

20 Claims, 11 Drawing Sheets

LOGIC-CELL-COMPATIBLE DECOUPLING CAPACITOR

CROSS-REFERENCE TO RELATED APPLICATIONS

This application claims the benefit of and incorporates by reference U.S. Provisional Application 61/289,455 filed Dec. 23, 2009.

FIELD OF THE INVENTION

This invention relates to the field of integrated circuits. More particularly, this invention relates to decoupling capacitors in integrated circuits.

BACKGROUND OF THE INVENTION

An integrated circuit may include complementary metal oxide semiconductor (CMOS) digital circuits, also known as logic circuits, which contain logic gates such as NAND gates, NOR gates and inverters. Logic gates are commonly powered by an upper voltage source, known as a Vdd bus, Vdd line, Vdd node or Vdd supply, and a lower voltage source, known as a Vss bus, Vss line, Vss node or Vss supply. During operation of the integrated circuit, the logic gates may pull current pulses when switching states to cause undesirable voltage transients on the Vdd and/or the Vss buses.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing CMOS logic gates may be formed by integrating one or more logic-cell-compatible decoupling capacitors adjacent to the logic gates. The logic-cell-compatible decoupling capacitors include n+/p and p+/n junction capacitors connected to Vdd and Vss buses through resistors. The resistors are between 1 and 1000 ohms, and may be formed, for example, of gate material or active area. Metal oxide semiconductor (MOS) gate elements are formed over the junction capacitors having widths, spacings and orientations similar to the adjacent logic gates. The junction capacitors may be formed in active areas which have similar dimensions and spacings to the adjacent logic gates.

DETAILED DESCRIPTION OF EXAMPLE EMBODIMENTS

Figure 1A:
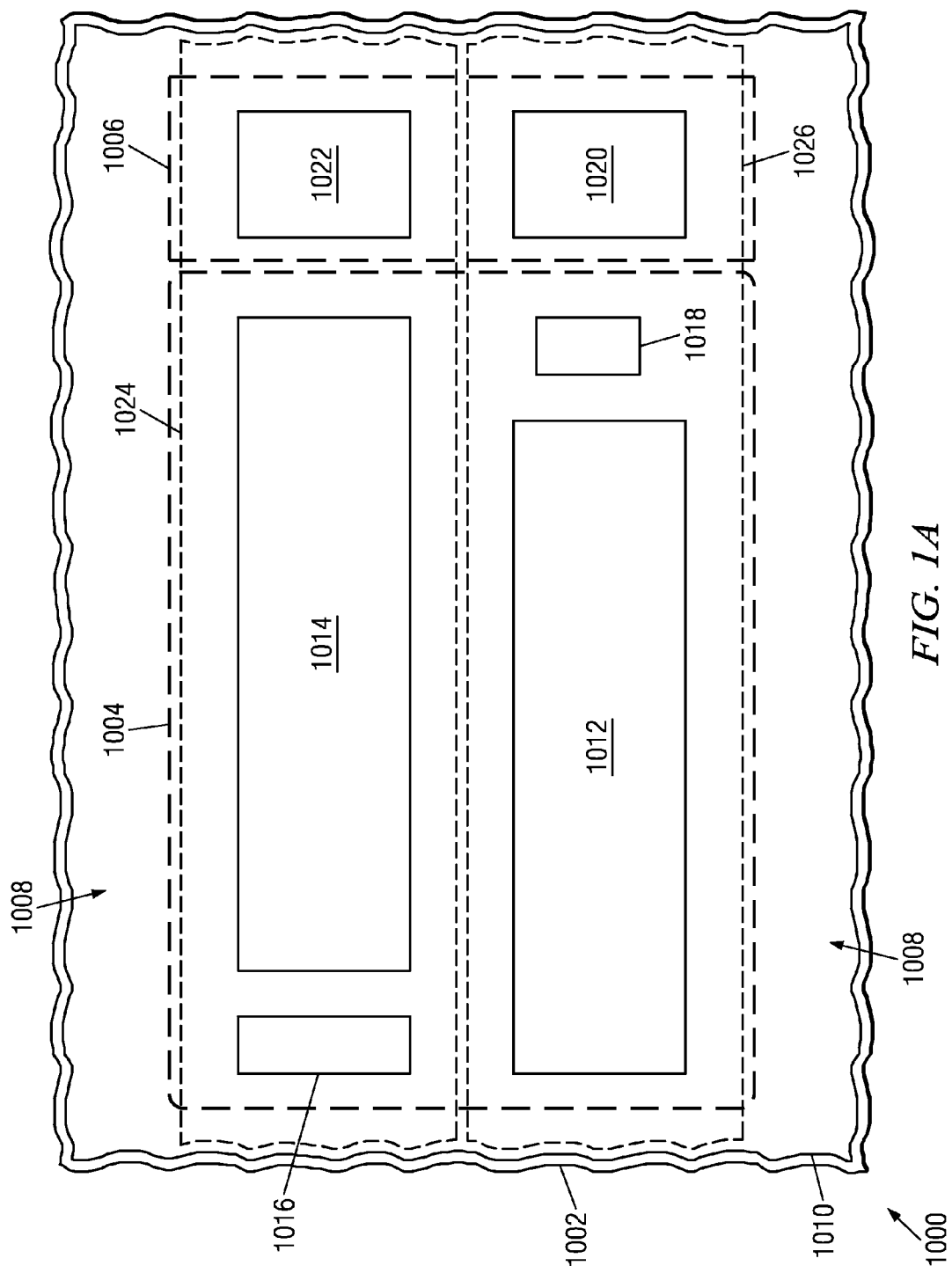
FIG. 1A through FIG. 1E are top views of an integrated circuit containing a logic-cell-compatible decoupling capacitor formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purpose of this description, the term "active area" is understood to mean an opening in field oxide, sometimes referred to as a diffusion area or a source/drain area. In some technologies, active areas are laterally isolated by shallow trench isolation (STI).

An integrated circuit may contain CMOS logic gates, such as NAND gates, NOR gates and/or inverters, which are powered by Vdd and Vss buses. The integrated circuit may be fabricated by forming one or more logic-cell-compatible decoupling capacitors adjacent to the logic gates, connected between the Vdd and Vss buses. The logic-cell-compatible decoupling capacitors include n+/p and p+/n junction capacitors connected to Vdd and Vss buses through resistors. The Vdd bus is connected to the n+ side of the n+/p capacitor and to the n side of the p+/n capacitor. The Vss bus is connected to the p side of the n+/p capacitor and to the p+side of the p+/n capacitor. The resistors are between 1 and 1000 ohms, so that lateral bipolar action is suppressed. Each junction capacitor is connected in series with at least one resistor. The resistors may be formed, for example, of gate material or active area, and may include contacts between a first metal interconnect level and the gate material or active area. MOS gate elements are formed over the junction capacitors having widths, spacings and orientations similar to the adjacent logic gates, so that a gate pattern lithographic process and a gate etch process may be performed without added complexity due to the cell compatible decoupling capacitor. The active areas containing the junction capacitors may have similar dimensions and spacings to active areas in the adjacent logic gates, so that field oxide formation process such as shallow trench isolation (STI) formation including chemical mechanical polishing (CMP), and source/drain pattern lithographic processes, may be performed without added complexity due to the cell compatible decoupling capacitor. An n-type well containing the p+/n capacitor and a p-type well containing the n+/p capacitor may have areas and dimensions similar to n-type wells and p-type wells in the adjacent logic gates, so that electrical performance of the adjacent logic gates is not degraded.

For the purposes of this description, the term "gate length" is understood to refer to the shortest lateral dimension of a gate element. In metal oxide semiconductor (MOS) transistors, gate length is the dimension parallel to current flow from a source to a drain of the MOS transistor. The term "gate width" is understood to refer to a lateral dimension of the gate element perpendicular to the gate length. For a rectangular gate element, the gate width is the longer of the lateral dimensions of the gate element. The term "gate spacing" is understood to refer to a lateral distance between adjacent gate elements parallel to gate lengths of the gate elements.

For the purposes of this description, the term "substantially equal" as applied to structures and elements formed in an integrated circuit is understood to mean equal within fabrication tolerances used to fabricate the integrated circuit.

For the purposes of this description, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation on a floated node.

FIG. 1A through FIG. 1E are top views of an integrated circuit containing a logic-cell-compatible decoupling capacitor formed according to an embodiment, depicted in successive stages of fabrication. Referring to FIG. 1A, the integrated circuit 1000 is formed in and on a semiconductor substrate 1002, such as a single crystal silicon wafer, a hybrid orientation technology (HOT) wafer with regions of different crystal orientations, or other material appropriate for fabrication of the integrated circuit 1000. An area for the logic-cell-compatible decoupling capacitor defined by the boundary of 1004 is defined in the integrated circuit 1000. The integrated circuit 1000 further includes an area for logic gates defined by the boundary of 1006 adjacent to the logic-cell-compatible decoupling capacitor 1004. The integrated circuit 1000 may also include additional logic gate areas 1008 above and/or below the logic-cell-compatible decoupling capacitor 1004.

Field oxide 1010 is formed at a top surface of the substrate 1002, for example by STI processes. In one version of the instant embodiment, the field oxide 1010 may be silicon dioxide between 250 and 600 nanometers thick. The silicon dioxide may be formed by a high density plasma (HDP) or a high aspect ratio process (HARP). The logic-cell-compatible decoupling capacitor 1004 includes an n+/p opening 1012 in the field oxide 1010 for an n+/p junction capacitor, and a p+/n opening 1014 for a p+/n junction capacitor. The logic-cell-compatible decoupling capacitor 1004 further includes a Vdd resistor opening 1016 adjacent to the p+/n opening 1014, and a Vss resistor opening 1018 adjacent to the n+/p opening 1012. The area for the logic gates 1006 includes one or more NMOS openings 1020 and one or more PMOS openings 1022. In one version of the instant embodiment, an average area density of the p+/n opening 1014 in the area for the logic-cell-compatible decoupling capacitor 1004 is between 75 percent and 150 percent of an average area density of the PMOS openings 1022 in the area for the logic gates 1006, and an average area density of the n+/p opening 1012 in the area for the logic-cell-compatible decoupling capacitor 1004 is between 75 percent and 150 percent of an average area density of the NMOS openings 1020 in the area for the logic gates 1006. The average area density of the p+/n opening 1014 in the area for the logic-cell-compatible decoupling capacitor 1004 is a ratio of the total area of the p+/n opening 1014 and any other p+/n openings in the area for the logic-cell-compatible decoupling capacitor 1004, for example in square microns, to the area, in square microns, of the logic-cell-compatible decoupling capacitor 1004. Similarly, the average area density of the PMOS openings 1022 in the area for the logic gates 1006 is a ratio of the total area of the PMOS openings 1022 in the area for the logic gates 1006, in square microns, to the area, in square microns, of the logic gates 1006. The average area density of the n+/p opening 1012 in the area for the logic-cell-compatible decoupling capacitor 1004 and the average area density of the NMOS openings 1020 in the area for the logic gates 1006 are defined in a similar manner.

An n-type well 1024, referred to herein as the n-well 1024, is formed in the substrate 1002 of which a portion is located in the area for the logic-cell-compatible decoupling capacitor 1004 under the p+/n opening 1014. The n-well 1024 extends into the area for the logic gates 1006 under the PMOS opening 1022. The n-well 1024 may be formed, for example, by ion implanting n-type dopants, including phosphorus and possibly arsenic and/or antimony, at doses from $1 \cdot 10^{11}$ to $1 \cdot 10^{14}$ atoms/cm$^2$, into the substrate 1002. An n-well photoresist pattern, not shown, may be used to block the n-type dopants from areas outside the n-well 1024. The n-well 1024 extends from the top surface of the substrate 1002 to a depth typically 50 to 500 nanometers below the bottom surface of the field oxide 1010. The ion implantation process to form the n-well 1024 may include additional steps to implant additional n-type dopants at shallower depths for purposes of improving PMOS transistor performance, such as threshold adjustment, leakage current reduction and suppression of parasitic bipolar operation. A sheet resistivity of the n-well 1024 is commonly between 100 and 1000 ohms/square.

A p-type well 1026, referred to herein as the p-well 1026, may be formed in the substrate 1002 of which a portion is located in the area for the logic-cell-compatible decoupling capacitor 1004 under the n+/p opening 1012. The p-well 1026 extends into the area for the logic gates 1006 under the NMOS opening 1020. The p-well 1026 may be formed, for example, by ion implanting p-type dopants, including boron and possibly gallium and/or indium, at doses from $1 \cdot 10^{11}$ to $1 \cdot 10^{14}$ atoms/cm$^2$, into the substrate 1002. A p-well photoresist pattern, not shown, may be used to block the p-type dopants from areas outside the p-well 1026. The p-well 1026 extends from the top surface of the substrate 1002 to a depth typically 50 to 500 nanometers below a bottom surface of the field oxide 1010. The ion implantation process to form the p-well 1026 may include additional steps to implant additional p-type dopants at shallower depths for purposes of improving NMOS transistor performance, such as threshold adjustment, leakage current reduction and suppression of parasitic bipolar operation. In one version of the instant embodiment, an average area density of the n-well 1024 in the area for the logic-cell-compatible decoupling capacitor 1004 is between 75 percent and 125 percent of an average area density of the n-well 1024 in the area for the logic gates 1006, and an average area density of the p-well 1026 in the area for the logic-cell-compatible decoupling capacitor 1004 is between 75 percent and 125 percent of an average area density of the p-well 1026 in the area for the logic gates 1006. The average area density of the n-well 1024 in the area for the logic-cell-compatible decoupling capacitor 1004 is a ratio of the total area of the n-well 1024 in the area for the logic-cell-compatible decoupling capacitor 1004, in square microns, to the area, in square microns, of the logic-cell-compatible decoupling capacitor 1004. Similarly, the average area density of the n-well 1024 in the area for the logic gates 1006 is a ratio of the total area of the n-well 1024 in the area for the logic gates 1006, in square microns, to the area, in square microns, of the logic gates 1006. The average area density of the p-well 1026 in the area for the logic-cell-compatible decoupling capacitor 1004 and the average area density of the p-well 1026 in the area for the logic gates 1006 are defined in a similar manner.

Figure 1B:
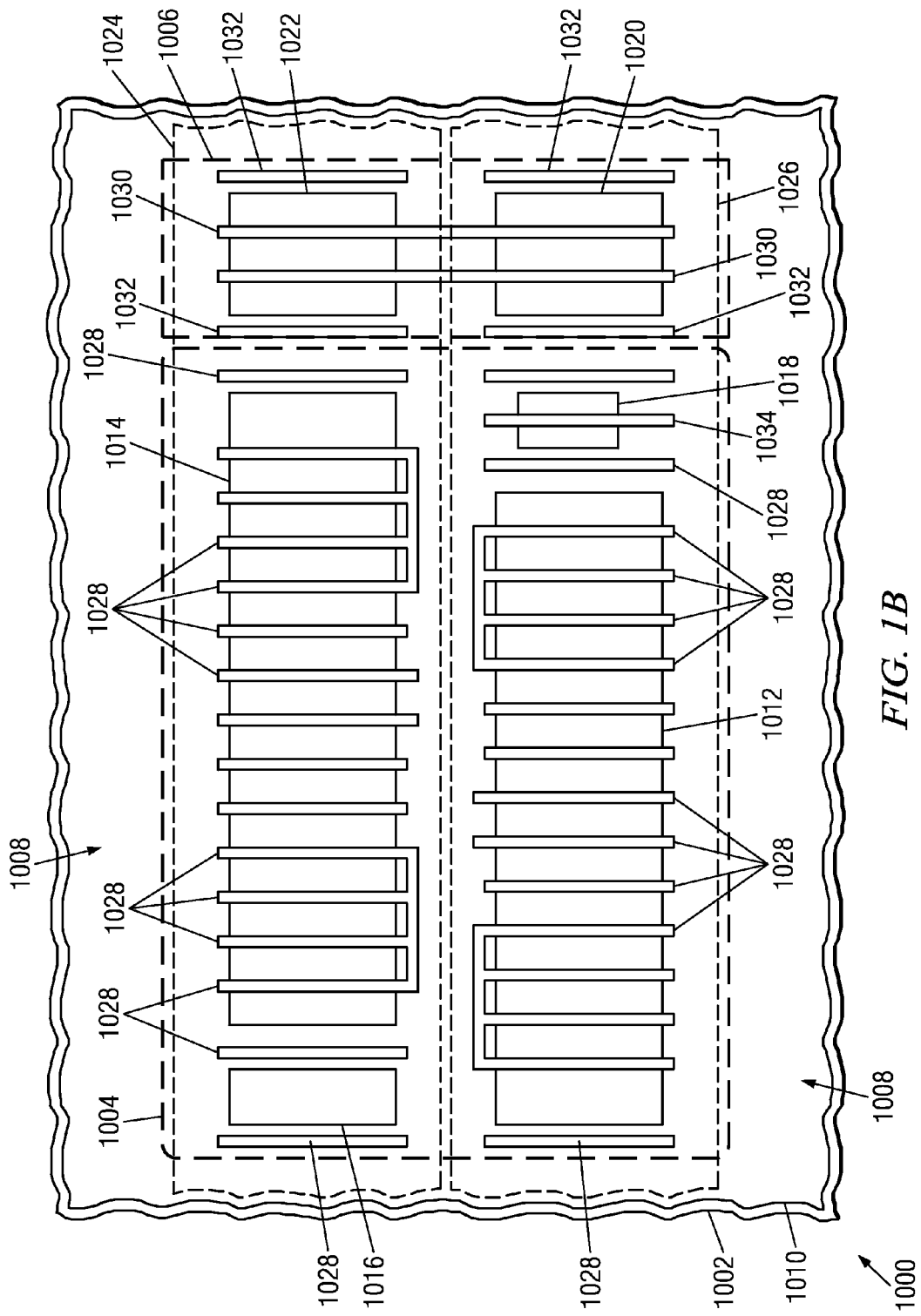

Referring to FIG. 1B, gate elements are formed in the integrated circuit by a process including forming one or more layers of gate dielectric material, not shown, on top surfaces of the substrate 1002 in the openings 1012, 1014, 1016, 1018, 1020 and 1022, forming one or more layers of gate material, such as polycrystalline silicon or titanium nitride, on the gate dielectric material, forming one or more gate etch patterns over the gate material, performing one or more gate etch processes to remove undesired gate material to leave the gate elements on the integrated circuit 1000. Gate material in the gate elements may subsequently be replaced by other gate material, such as fully silicided polycrystalline silicon or metal. Multiple pass photolithographic process sequences to form the gate etch patterns, such as litho-etch-litho-etch and litho-freeze-litho-etch, are within the scope of the instant embodiment. Gate elements formed by other processes are within the scope of the instant embodiment.

The gate elements include at least three decoupling capacitor gate elements 1028 over the n+/p opening 1012 and at least three decoupling capacitor gate elements 1028 over the p+/n opening 1014, logic gate elements 1030 overlapping the NMOS opening 1020 and the PMOS opening 1022 in the area for logic gates 1006, and possibly photolithography enhancement gate elements 1032 in the area for logic gates 1006. In one version of the instant embodiment, one or more instances of the logic gate elements 1030 and/or the photolithography enhancement gate elements 1032 is within 1 micron of an instance of the decoupling capacitor gate elements 1028. In another version, an instance of the decoupling capacitor gate elements 1028 may abut or overlap an instance of the photolithography enhancement gate elements 1032. Instances of the decoupling capacitor gate elements 1028 may be connected to each other by additional gate material or may be isolated.

A median value of gate lengths of the decoupling capacitor gate elements 1028 is between 50 percent and 200 percent of a median value of gate lengths of the logic gate elements 1030 and the photolithography enhancement gate elements 1032. A median value of gate spacings between adjacent instances of the decoupling capacitor gate elements 1028 is between 50 percent and 200 percent of a median value of gate spacings between adjacent instances of the logic gate elements 1030 and the photolithography enhancement gate elements 1032. A median value of gate widths of the decoupling capacitor gate elements 1028 is between 75 percent and 150 percent of a median value of gate widths of the logic gate elements 1030 and the photolithography enhancement gate elements 1032.

A gate material resistor element 1034 of a Vss resistor is also formed of gate material, concurrently with the gate elements 1028, 1030 and 1032. The gate material resistor element 1034 may extend over an opening in the field oxide 1010 as depicted in FIG. 1B or may be located entirely over the field oxide 1010.

Figure 1C:
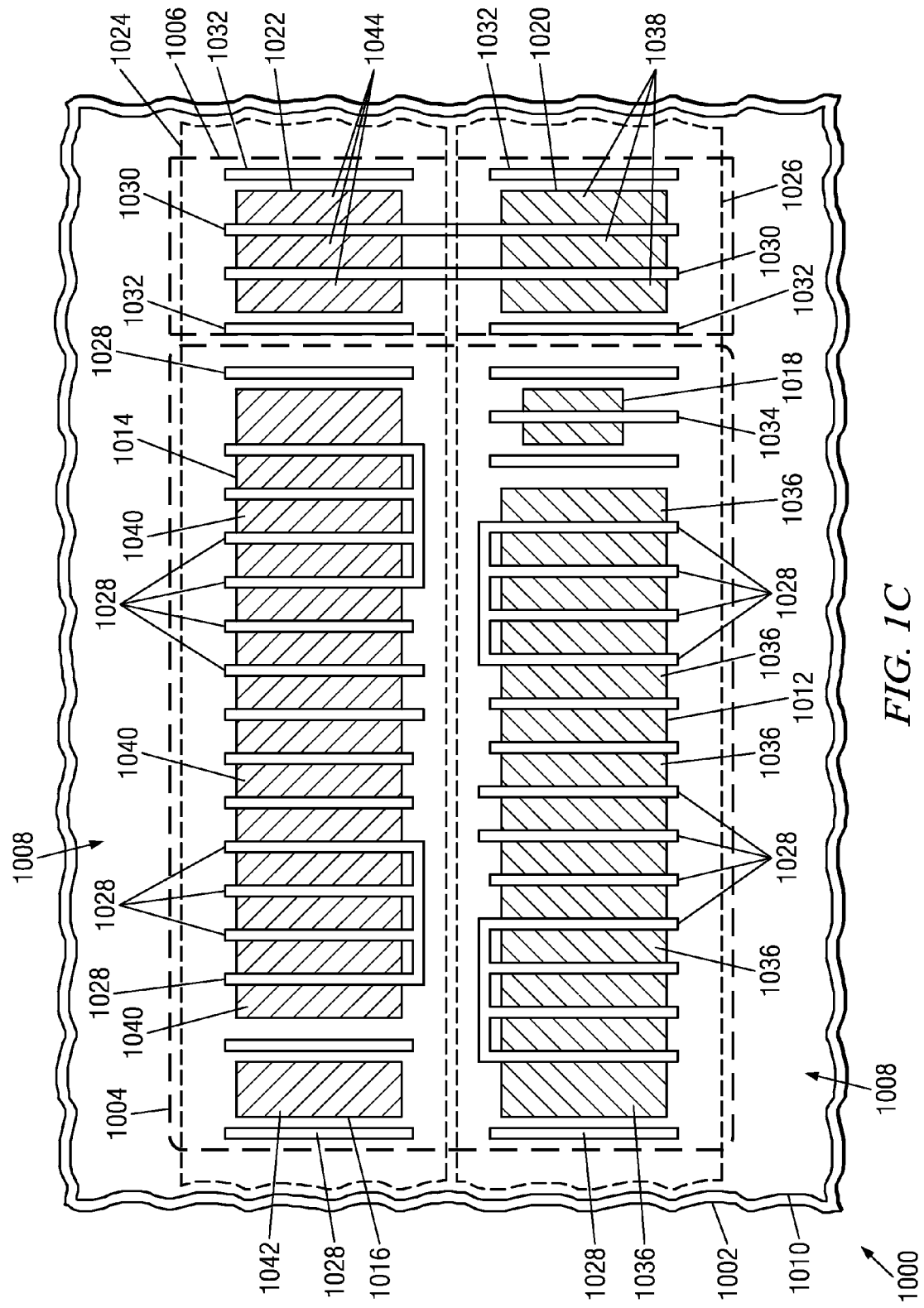

Referring to FIG. 1C, a plurality of n-type source/drain (NSD) regions and a plurality of p-type source/drain (PSD) regions are formed in the substrate 1002 in the openings in the field oxide 1010. The NSD regions may be formed, for example, by ion implanting an NSD set of n-type dopants, including phosphorus and arsenic, and possibly antimony, at a total dose between $3 \cdot 10^{14}$ and $3 \cdot 10^{16}$ atoms/cm$^2$ into the substrate. An NSD photoresist pattern, not shown, is commonly used to block the NSD dopants from areas outside the NSD implanted regions. An NSD anneal operation activates at least a portion of the n-type dopants in the NSD implanted regions to form the NSD regions. The NSD regions may extend from the top surface of the substrate 1002 to a depth between 100 and 500 nanometers. The NSD regions may include n-type lightly doped drain (NLDD) layers adjacent to the gate elements, under gate sidewall spacers, not shown, formed on vertical surfaces of the gate elements prior to ion implanting the NSD dopants. The NSD regions include n+ plates 1036 of the n+/p capacitor and NMOS source/drain layers 1038 in the area for the logic gates 1006.

The PSD regions may be formed, for example, by ion implanting a PSD set of n-type dopants, including boron and/or boron difluoride, and possibly gallium and/or indium, at a total dose between $5 \cdot 10^{14}$ and $3 \cdot 10^{16}$ atoms/cm$^2$ into the substrate. A PSD photoresist pattern, not shown, is commonly used to block the PSD dopants from areas outside the PSD implanted regions. A PSD anneal operation, which may be the NSD anneal operation, activates at least a portion of the p-type dopants in the PSD implanted regions to form the PSD regions. The PSD regions may extend from the top surface of the substrate 1002 to a depth between 100 and 500 nanometers. The PSD regions may include p-type lightly doped drain (PLDD) layers adjacent to the gate elements, under gate sidewall spacers, not shown, formed on vertical surfaces of the gate elements prior to ion implanting the PSD dopants. The PSD regions include p+ plates 1040 of the p+/n capacitor, a p+ resistor element 1042 of a Vdd resistor, and PMOS source/drain layers 1044 in the area for the logic gates 1006.

One or more layers of metal silicide, not shown, may be formed on exposed surfaces of the NSD regions and PSD regions and possibly the gate elements. The metal silicide layers may be formed for example, by depositing a layer of metal, such as nickel, on a top surface of the integrated circuit 1000, heating the integrated circuit 1000 to react a portion of the metal with exposed silicon, and selectively removing unreacted metal from the integrated circuit 1000 surface, commonly by exposing the integrated circuit 1000 to wet etchants including a mixture of an acid and hydrogen peroxide. Forming metal silicide may reduce sheet resistances of the NSD regions, the PSD regions and the gate elements to between 8 and 25 ohms/square.

Figure 1D:
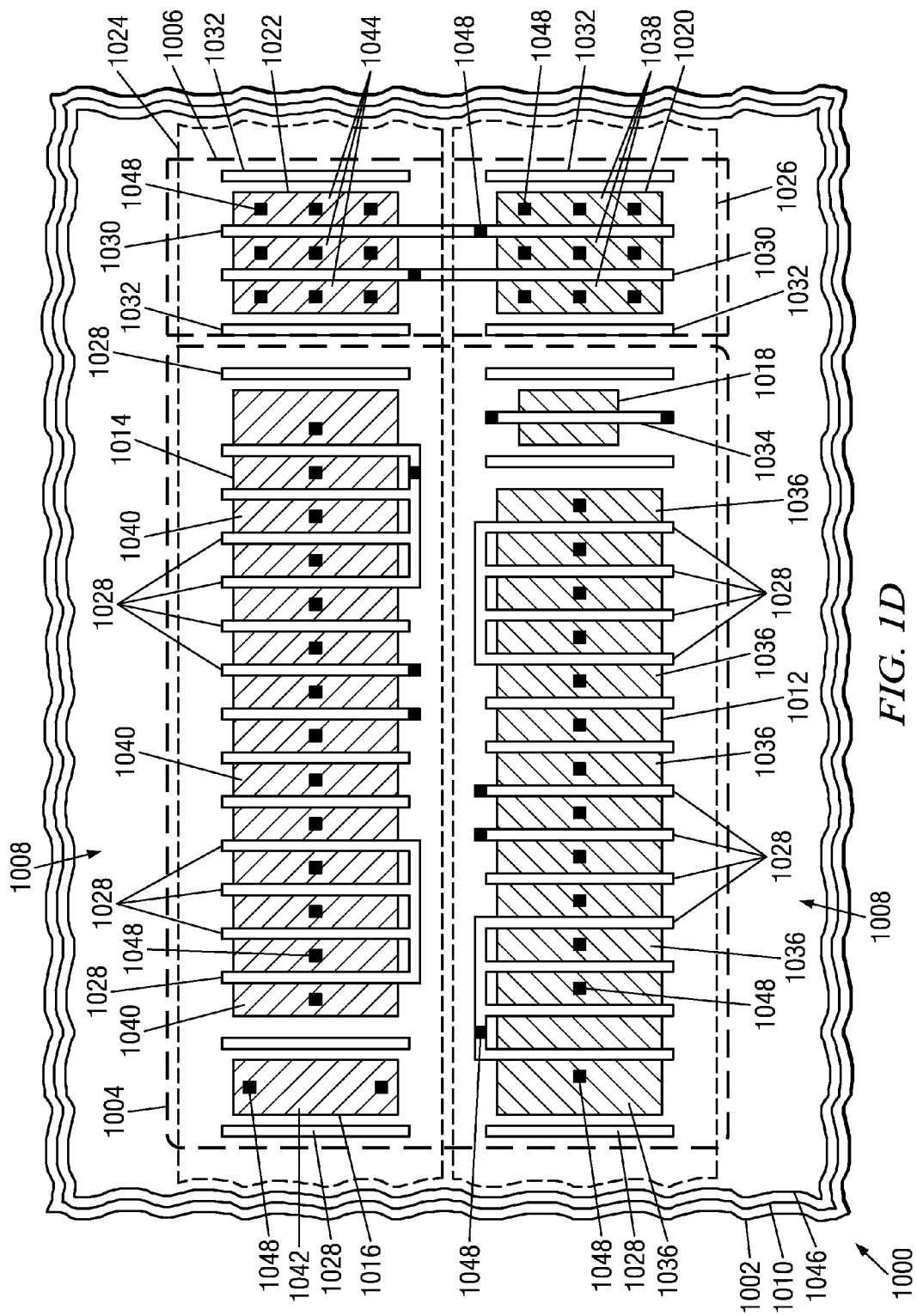

Referring to FIG. 1D, a pre-metal dielectric (PMD) layer 1046 is formed over an existing top surface of the integrated circuit 1000. The PMD layer 1046 may be a dielectric layer stack including a PMD liner, a PMD main layer, and an optional PMD cap layer. The PMD liner is commonly silicon nitride or silicon dioxide, 10 to 100 nanometers thick, deposited by plasma enhanced chemical vapor deposition (PECVD). The PMD main layer is commonly a layer of silicon dioxide, phospho-silicate glass (PSG) or boro-phospho-silicate glass (BPSG), commonly 100 to 1000 nanometers thick, deposited by PECVD or HARP on a top surface of the PMD liner, and sometimes leveled by a CMP process. The optional PMD cap layer may be 10 to 100 nanometers of a hard material such as silicon nitride, silicon carbide nitride or silicon carbide, formed on a top surface of the PMD main layer. The PMD layer 1046 may include one or more layers which impart stress to channels of transistors in the integrated circuit 1000. In some versions of the instant embodiment, material in a portion or all of the gate elements may be replaced by another gate material such as metal or metal silicide, after formation of the NSD regions and PSD regions and prior to forming the PMD layer 1046.

A plurality of contacts 1048 are formed in the PMD layer 1046 so as to make electrical contact to the NSD regions, the PSD regions and the gate elements. The contacts 1048 may be formed, for example, by defining contact areas on a top surface of the PMD layer 1046 with a contact photoresist pattern, not shown. Contact holes in the contact areas are formed by removing PMD layer material using an anisotropic etch process such as a reactive ion etch (RIE) process including fluorine ions. The contact holes are filled with a contact liner metal, such as titanium, and a contact fill metal, such as tungsten. The tungsten contact fill metal may be deposited by a metal organic chemical vapor deposition (MOCVD) process. Excess contact liner metal and contact fill metal may be removed from the top surface of the PMD layer 1046 using etching and/or CMP methods. Contacts formed by other processes are within the scope of the instant embodiment. Instances of the contacts 1048 are formed on the n+ plates 1036, the NMOS source/drain layers 1038, the p+ plates 1040, the p+ resistor element 1042, the PMOS source/drain layers 1044, the logic gate elements 1030 and possibly one or more instances of the decoupling capacitor gate elements 1028.

Figure 1E:
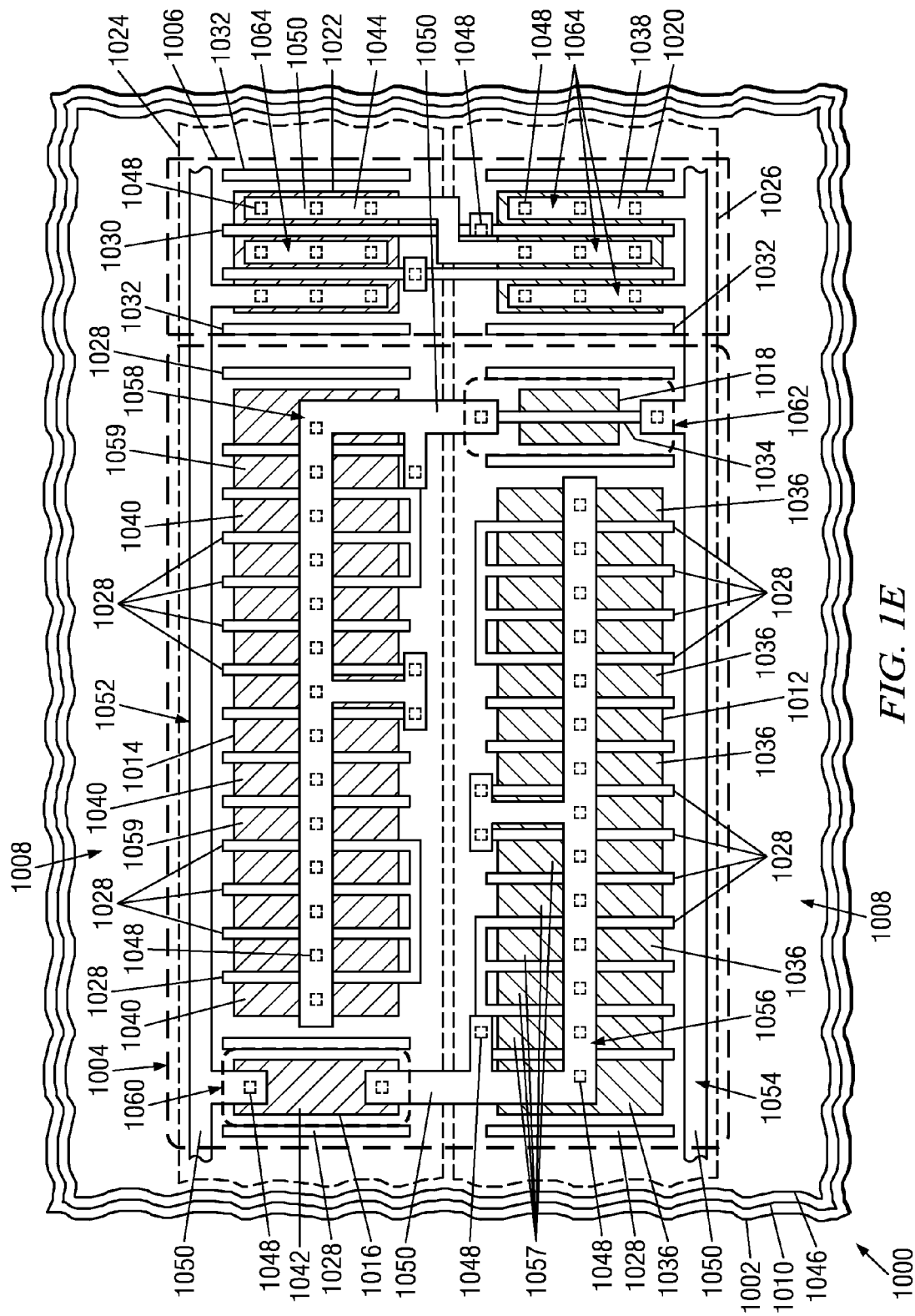

Referring to FIG. 1E, a plurality of metal interconnects 1050 are formed in the integrated circuit 1000 over the PMD layer 1046 so as to electrically connect to the contacts 1048. The contacts 1048 in FIG. 1E are depicted with hidden lines to show their locations under the metal interconnects 1050. The metal interconnects 1050 may be copper interconnects formed by a damascene process, for example. The damascene process includes forming an intra level dielectric (ILD) layer, not shown, on an existing top surface of the integrated circuit 1000. An interconnect trench is formed in the ILD layer, commonly between 50 and 150 nanometers deep. A layer of liner metal such as tantalum nitride is formed on a bottom and sides of the trench, commonly by physical vapor deposition, atomic layer deposition or chemical vapor deposition. A seed layer of copper is formed on the liner metal, commonly by sputtering. The trench is subsequently filled with copper, commonly by electroplating. Copper and liner metal are removed from a top surface of the ILD layer by CMP and etch processes, leaving the copper interconnect line in the ILD layer.

The metal interconnects 1050 include a Vdd bus 1052, a Vss bus 1054, an n+/p capacitor bus 1056 and a p+/n capacitor bus 1058. The Vdd bus 1052 and the Vss bus 1054 extend into the area defined for the logic-cell-compatible decoupling capacitor 1004 and into the area for the logic gates 1006. The n+/p capacitor bus 1056 is electrically coupled to the Vdd bus 1052 through a Vdd resistor 1060 which includes at least two contacts 1048 and at least one element of electrically conductive material which is different from the metal interconnects 1050, such as a gate material resistor element or the p+ resistor element 1042. The n+/p capacitor bus 1056 is electrically coupled through contacts 1048 to n+/p junction capacitor elements 1057 at a boundary between the n+ plates 1036 and the p-well 1026. The p+/n capacitor bus 1058 is electrically coupled to the Vss bus 1054 through a Vss resistor 1062 which includes at least two contacts 1048 and at least one element of electrically conductive material which is different from the metal interconnects 1050, such as the gate material resistor element 1034 or an NSD region. The p+/n capacitor bus 1058 is electrically coupled through contacts 1048 to p+/n junction capacitor elements 1059 at a boundary between the p+ plates 1040 and the n-well 1024.

Instances of the decoupling capacitor gate elements 1028 over the n+/p opening 1012 are not directly electrically connected to instances of the capacitor gate elements 1028 over the p+/n opening 1014. In one version of the instant embodiment, instances of the decoupling capacitor gate elements 1028 over the n+/p opening 1012 may be floated or electrically coupled to the n+/p capacitor bus 1056, and instances of the capacitor gate elements 1028 over the p+/n opening 1014 may be floated or electrically coupled to the p+/n capacitor bus 1058, as depicted in FIG. 1E.

The metal interconnects 1050 also include logic gate interconnects 1064 in the area for the logic gates 1006. The area for the logic gates 1006 may include any combination of NAND gates, NOR gates and inverters. In one version of the instant embodiment, an average area density of the metal interconnects 1050 in the area for the logic-cell-compatible decoupling capacitor 1004 is between 50 percent and 200 percent of an average area density of the metal interconnects 1050 in the area for the logic gates 1006. The average area density of the metal interconnects 1050 in the area for the logic-cell-compatible decoupling capacitor 1004 is a ratio of the total area of the metal interconnects 1050 in the area for the logic-cell-compatible decoupling capacitor 1004, in square microns, to the area, in square microns, of the logic-cell-compatible decoupling capacitor 1004. Similarly, the average area density of the metal interconnects 1050 in the area for the logic gates 1006 is a ratio of the total area of the metal interconnects 1050 in the area for the logic gates 1006, in square microns, to the area, in square microns, of the logic gates 1006.

Figure 2:
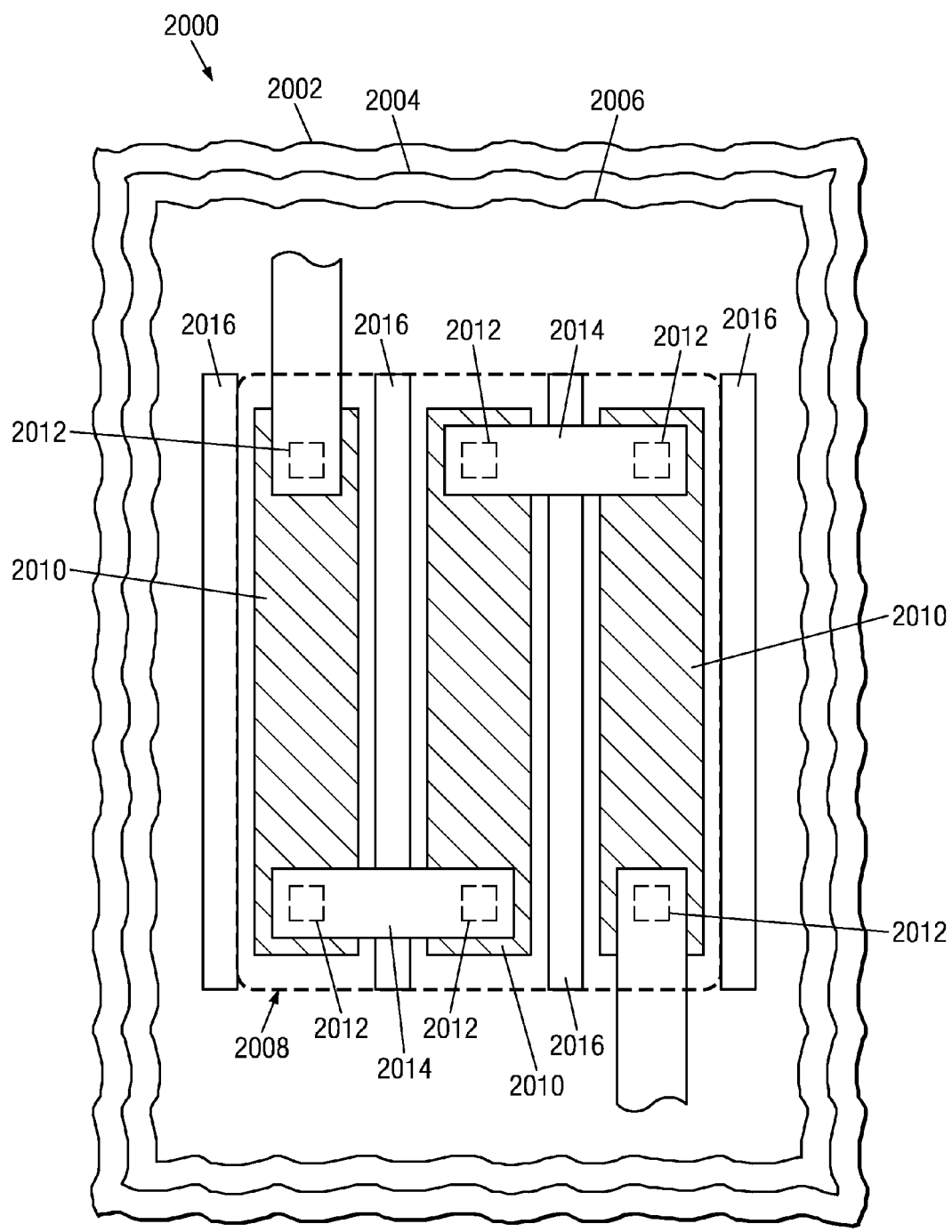
FIG. 2 through FIG. 7 are top views of Vdd and Vss resistors, referred to as Vdd/Vss resistors, formed according to different embodiments.

It will be recognized that the Vdd resistor 1060 and the Vss resistor 1062 may have any of several manifestations. FIG. 2 through FIG. 7 are top views of Vdd and Vss resistors, referred to as Vdd/Vss resistors, formed according to different embodiments. Referring to FIG. 2, an integrated circuit 2000 includes a semiconductor substrate 2002, field oxide 2004 and a PMD layer 2006 as described in reference to FIG. 1A through FIG. 1E. A Vdd/Vss resistor 2008 includes a series combination of active area resistor legs 2010, contacts 2012 and metal interconnect links 2014. Optional photolithography enhancement gate elements 2016 may also be added.

Figure 3:
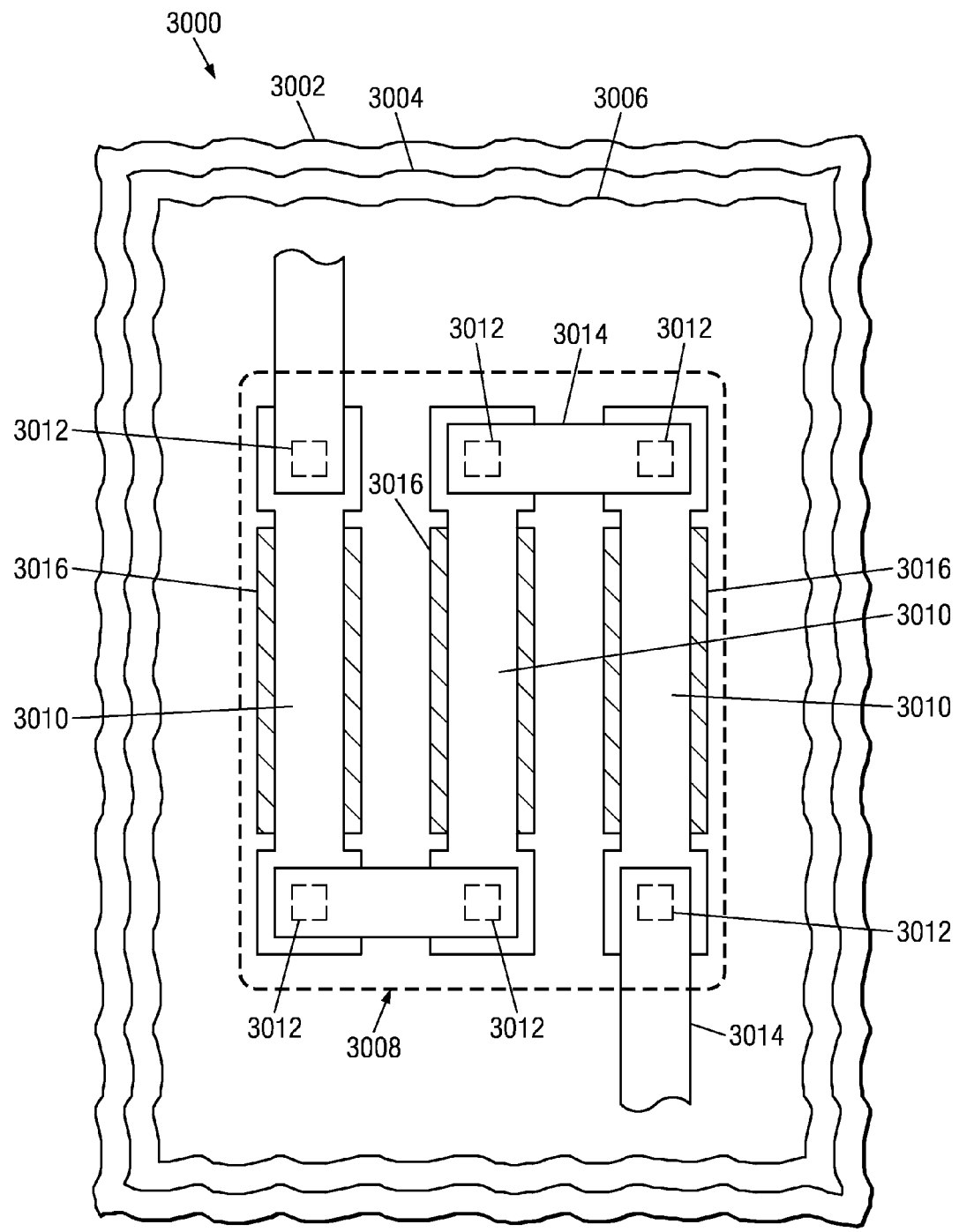

Referring to FIG. 3, an integrated circuit 3000 includes a semiconductor substrate 3002, field oxide 3004 and a PMD layer 3006 as described in reference to FIG. 1A through FIG. 1E. A Vdd/Vss resistor 3008 includes a series combination of gate material resistor legs 3010, contacts 3012 and metal interconnect links 3014. The gate material resistor legs 3010 may be formed over active areas 3016 as depicted in FIG. 3, or may be formed completely over the field oxide 3004.

Figure 4:
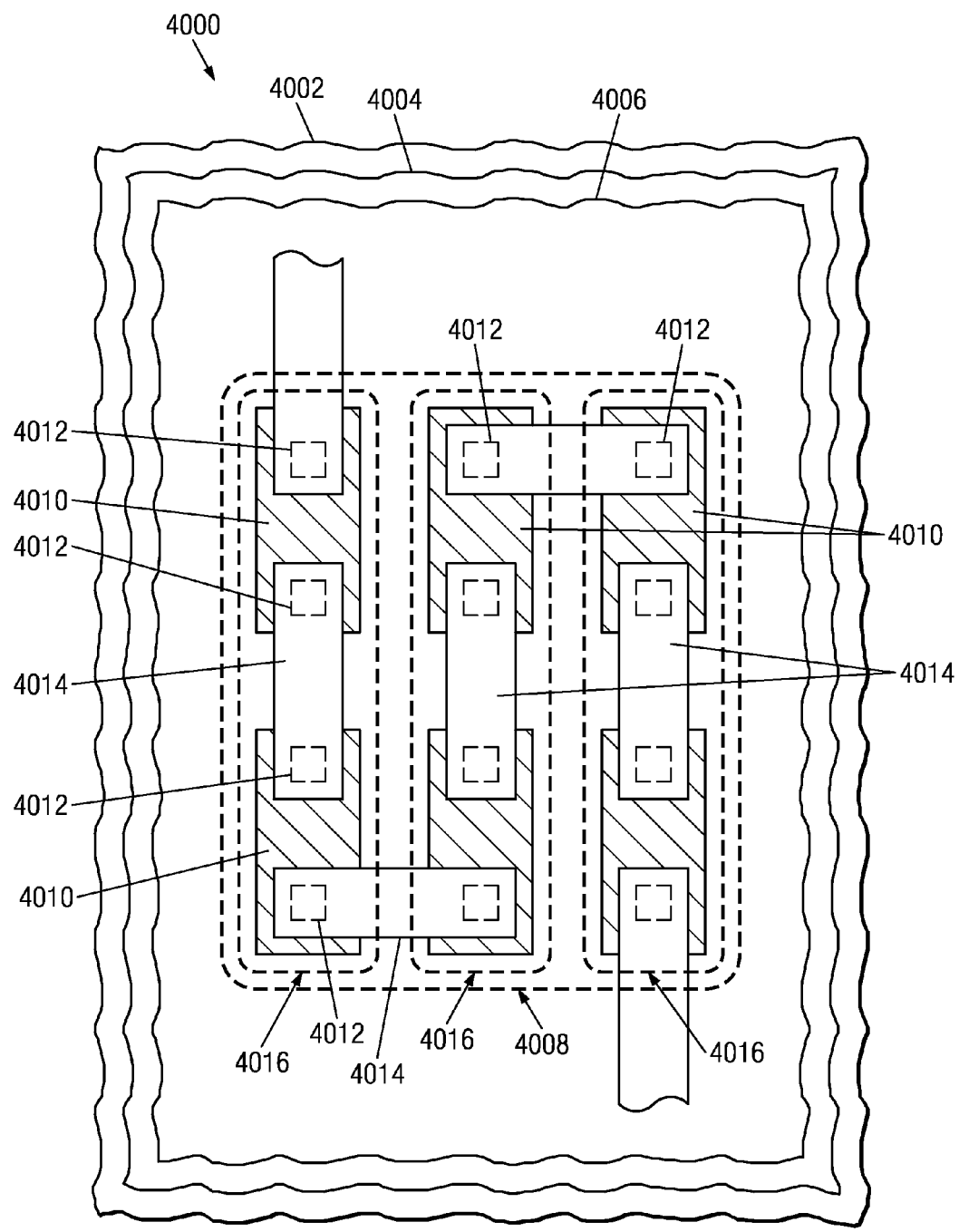

Referring to FIG. 4, an integrated circuit 4000 includes a semiconductor substrate 4002, field oxide 4004 and a PMD layer 4006 as described in reference to FIG. 1A through FIG. 1E. A Vdd/Vss resistor 4008 includes a series combination of gate material links 4010, contacts 4012 and metal interconnect links 4014, with at least three contacts 4012 in each resistor leg 4016.

Figure 5:
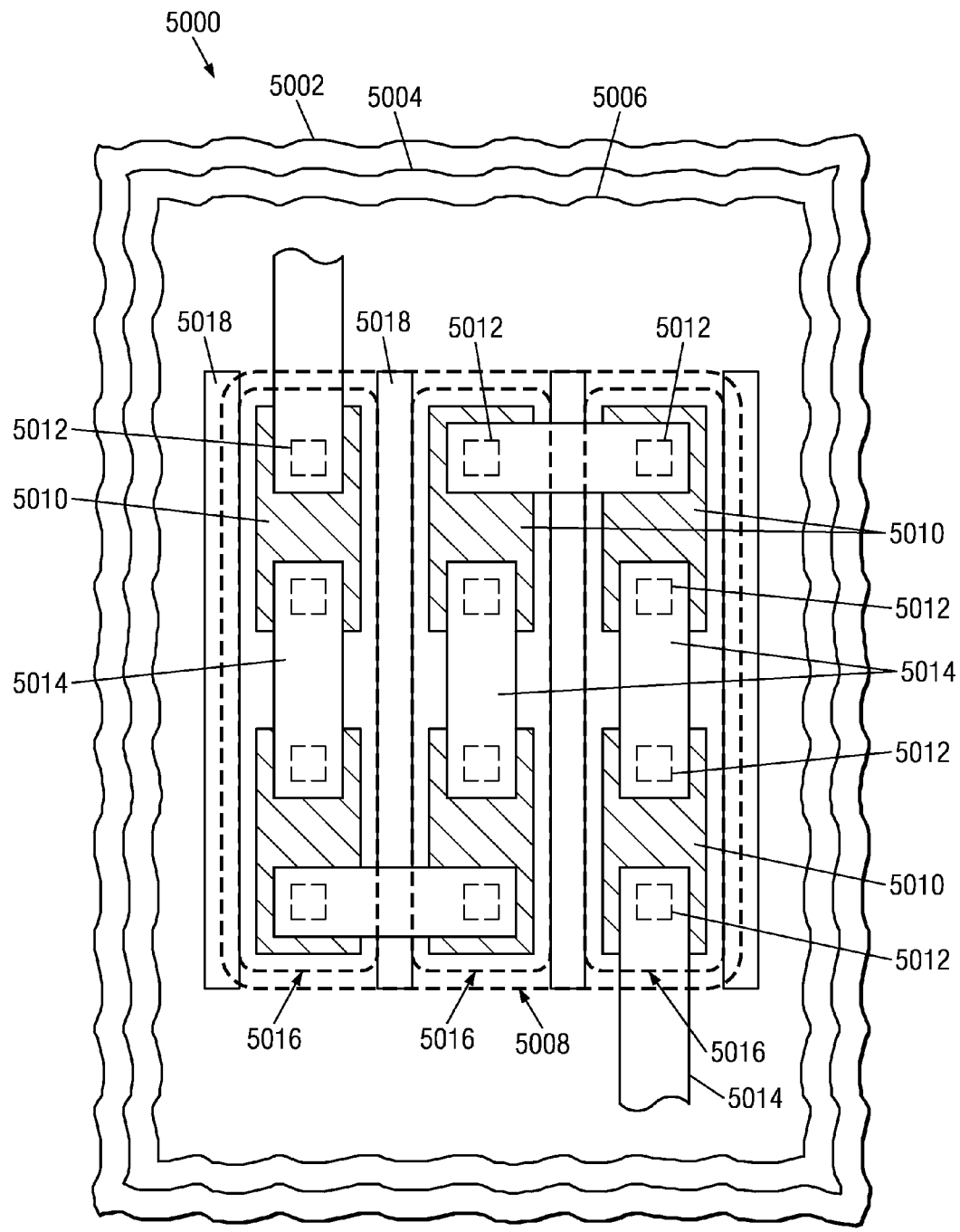

Referring to FIG. 5, an integrated circuit 5000 includes a semiconductor substrate 5002, field oxide 5004 and a PMD layer 5006 as described in reference to FIG. 1A through FIG. 1E. A Vdd/Vss resistor 5008 includes a series combination of active area links 5010, contacts 5012 and metal interconnect links 5014, with at least three contacts 5012 in each resistor leg 5016. Optional photolithography enhancement gate elements 5018 may also be added.

Figure 6:
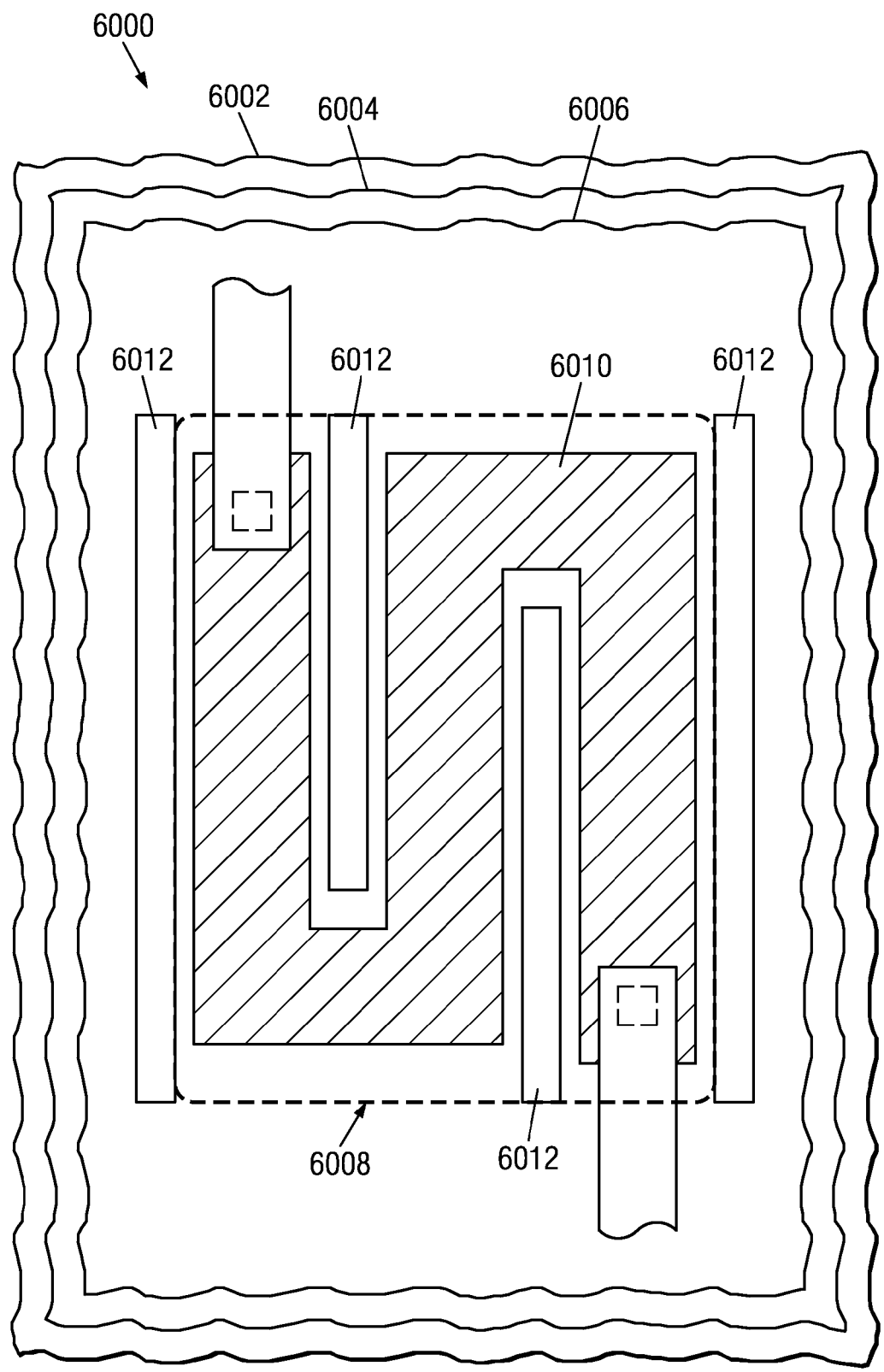

Referring to FIG. 6, an integrated circuit 6000 includes a semiconductor substrate 6002, field oxide 6004 and a PMD layer 6006 as described in reference to FIG. 1A through FIG. 1E. A Vdd/Vss resistor 6008 includes a serpentine active area element 6010. Optional photolithography enhancement gate elements 6012 may also be added.

Figure 7:
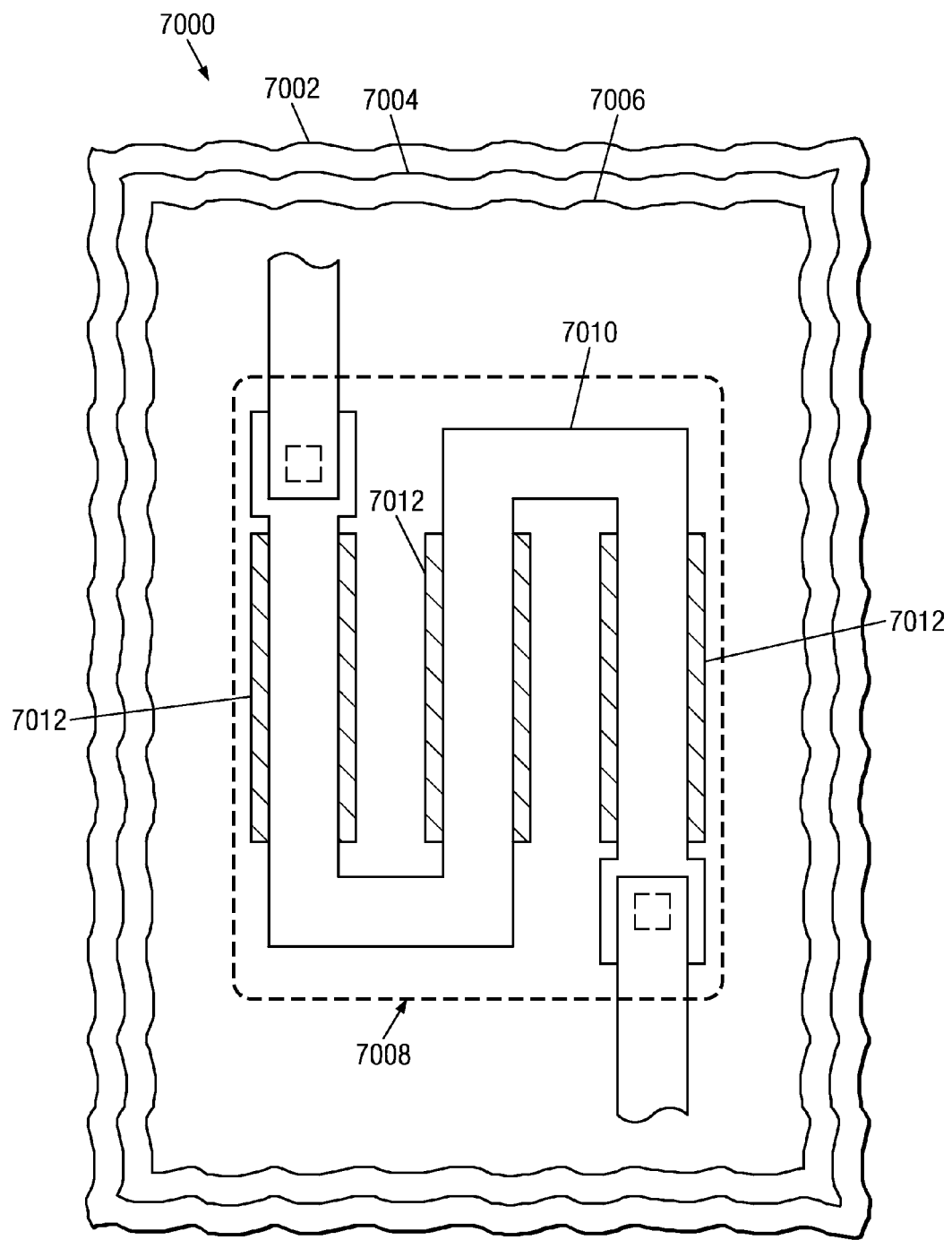

Referring to FIG. 7, an integrated circuit 7000 includes a semiconductor substrate 7002, field oxide 7004 and a PMD layer 7006 as described in reference to FIG. 1A through FIG. 1F. A Vdd/Vss resistor 7008 includes a serpentine gate material element 7010. Optional active area 7012 may also be included.

Other manifestations of Vdd/Vss resistors which include gate material elements, active area elements, contacts, metal interconnect elements and/or any combination thereof are within the scope of the instant invention.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a semiconductor substrate;
field oxide located at a top surface of said substrate, said field oxide having a plurality of openings which expose said substrate;
an n-well located in said substrate, such that a plurality of said openings in said field oxide are located in said n-well;
a p-well located in said substrate, such that a plurality of said openings in said field oxide are located in said p-well;
a layer of gate dielectric material located at said top surface of said substrate in said openings in said field oxide;
a plurality of gate elements located on said layer of gate dielectric material;
a plurality of n-type source/drain (NSD) regions located in said substrate in said openings in said field oxide in said p-well;
a plurality of p-type source/drain (PSD) regions located in said substrate in said openings in said field oxide in said n-well;
a pre-metal dielectric (PMD) layer located over said field oxide, said gate elements, said NSD regions and said PSD regions;
a plurality of contacts located in said PMD layer, said contacts making electrical connection to said gate elements, said NSD regions and said PSD regions;
a plurality of metal interconnects located over said PMD layer, said metal interconnects making electrical connection to said contacts;
an area containing logic gates, including:
a portion of said field oxide;
a portion of said n-well;
a portion of said p-well;
an n-channel metal oxide semiconductor (NMOS) opening in said field oxide located in said p-well, said NMOS opening being one of said openings in said field oxide;
a p-channel metal oxide semiconductor (PMOS) opening in said field oxide located in said n-well, said PMOS opening being one of said openings in said field oxide;
logic gate elements overlapping said NMOS opening and said PMOS opening, said logic gate elements being a portion of said gate elements;
a portion of said PMD layer;
logic gate interconnects, said logic gate interconnects being instances of said metal interconnects;
a portion of a Vdd bus, said Vdd bus being one instance of said metal interconnects; and
a portion of a Vss bus, said Vss bus being one instance of said metal interconnects; and
a logic-cell-compatible decoupling capacitor located adjacent to said area containing logic gates, said logic-cell-compatible decoupling capacitor including;
a portion of said field oxide;
a portion of said n-well, such that an average area density of said n-well in an area for said logic-cell-compatible decoupling capacitor is between 75 percent and 125 percent of an average area density of said n-well in said area containing said logic gates;
a portion of said p-well, such that an average area density of said p-well in an area for said logic-cell-compatible decoupling capacitor is between 75 percent and 125 percent of an average area density of said p-well in said area containing said logic gates;
a p+/n opening in said field oxide located in said n-well, said p+/n opening being one of said openings in said field oxide;
an n+/p opening in said field oxide located in said p-well, said n+/p opening being one of said openings in said field oxide;
at least three decoupling capacitor gate elements located over said p+/n opening and at least three decoupling capacitor gate elements located over said n+/p opening, said decoupling capacitor gate elements being a portion of said gate elements, such that
a median value of gate lengths of said decoupling capacitor gate elements is between 50 percent and 200 percent of a median value of gate lengths of said logic gate elements;
a median value of gate widths of said decoupling capacitor gate elements is between 75 percent and 150 percent of a median value of gate widths of said logic gate elements;
a median value of gate spacings between adjacent instances of said decoupling capacitor gate elements is between 50 percent and 200 percent of a median value of gate spacings between adjacent instances of said logic gate elements; and
said decoupling capacitor gate elements over said n+/p opening are not directly electrically connected to said capacitor gate elements over said p+/n opening;
a plurality of n+ plates located in said n+/p opening, such that n+/p junction capacitor elements exist at a boundary between said n+ plates and said p-well, said n+ plates being a portion of said NSD regions;
a plurality of p+ plates located in said p+/n opening, such that p+/n junction capacitor elements exist at a boundary between said p+ plates and said n-well, said p+ plates being a portion of said PSD regions;
a portion of said PMD layer;
a plurality of said contacts, said contacts making electrical connection to said n+ plates and said p+ plates;
a portion of said Vdd bus,
a portion of said Vss bus;
an n+/p capacitor bus making electrical connection to said contacts making electrical connection to said n+ plates, said n+/p capacitor bus being one instance of said metal interconnects;
an p+/n capacitor bus making electrical connection to said contacts making electrical connection to said p+ plates, said p+/n capacitor bus being one instance of said metal interconnects;
a Vdd resistor connecting said Vdd bus to said n+/p capacitor bus, said Vdd resistor containing at least two instances of said contacts and at least one element of electrically conductive material which is different from said metal interconnects; and
a Vss resistor connecting said Vss bus to said p+/n capacitor bus, said Vss resistor containing at least two instances of said contacts and at least one element of electrically conductive material which is different from said metal interconnects.

2. The integrated circuit of claim 1, in which at least one instance of said logic gate elements is within 1 micron of an instance of said decoupling capacitor gate elements.

3. The integrated circuit of claim 1, in which an average area density of said metal interconnects in said area for said logic-cell-compatible decoupling capacitor is between 50 percent and 200 percent of an average area density of said metal interconnects in said area containing logic gates.

4. The integrated circuit of claim 1, in which at least a portion of said decoupling capacitor gate elements are floated.

5. The integrated circuit of claim 1, in which:
at least a portion of said decoupling capacitor gate elements located over said p+/n opening are connected to said p+/n capacitor bus; and
at least a portion of said decoupling capacitor gate elements located over said n+/p opening are connected to said n+/p capacitor bus.

6. The integrated circuit of claim 5, in which an average area density of said metal interconnects in said area for said logic-cell-compatible decoupling capacitor is between 50 percent and 200 percent of an average area density of said metal interconnects in said area containing the logic gates.

7. The integrated circuit of claim 1, in which at least one of said Vdd resistor and said Vss resistor includes at least one active area resistor leg.

8. The integrated circuit of claim 1, in which at least one of said Vdd resistor and said Vss resistor includes at least one gate material resistor leg.

9. The integrated circuit of claim 1, in which at least one of said Vdd resistor and said Vss resistor includes at least four instances of said contacts.

10. The integrated circuit of claim 1, in which at least one of said Vdd resistor and said Vss resistor includes a serpentine gate material element.

11. A process of forming an integrated circuit, comprising the steps:
providing a semiconductor substrate;
defining an area for a logic-cell-compatible decoupling capacitor in said substrate;
defining an area for logic gates in said substrate adjacent to said area for said logic-cell-compatible decoupling capacitor;
forming field oxide at a top surface of said substrate overlapping said area for said logic-cell-compatible decoupling capacitor and said area for said logic gates, such that said field oxide has a plurality of openings which expose said substrate, such that:
a plurality of said openings are located in said area for said logic-cell-compatible decoupling capacitor; and
a plurality of said openings are located in said area for said logic gates;
forming a n-well in said substrate, said n-well extending into said area for said logic-cell-compatible decoupling capacitor and said area for said logic gates, such that an average area density of said n-well in said area for said logic-cell-compatible decoupling capacitor is between 75 percent and 125 percent of an average area density of said n-well in said area for said logic gates, and such that said openings in said field oxide include a PMOS opening located in said n-well in said area for said logic gates and an n+/p opening located in said n-well in said area for said logic-cell-compatible decoupling capacitor;
forming a p-well in said substrate, said p-well extending into said area for said logic-cell-compatible decoupling capacitor and said area for said logic gates, such that an average area density of said p-well in said area for said logic-cell-compatible decoupling capacitor is between 75 percent and 125 percent of an average area density of said p-well in said area for said logic gates, and such that said openings in said field oxide include an NMOS opening located in said p-well in said area for said logic gates and a p+/n opening located in said p-well in said area for said logic-cell-compatible decoupling capacitor;
forming at least one layer of gate dielectric material on said top surface of said substrate in said openings in said field oxide;
forming a plurality of gate elements on said layer of gate dielectric material, said gate elements including:
logic gate elements overlapping said NMOS opening and said PMOS opening; and
at least three instances of said decoupling capacitor gate elements formed overlapping said p+/n opening and at least three instances of said decoupling capacitor gate elements formed overlapping said n+/p opening, such that:
a median value of gate lengths of said decoupling capacitor gate elements is between 50 percent and 200 percent of a median value of gate lengths of said logic gate elements;
a median value of gate widths of said decoupling capacitor gate elements is between 75 percent and 150 percent of a median value of gate widths of said logic gate elements;
a median value of gate spacings between adjacent instances of said decoupling capacitor gate elements is between 50 percent and 200 percent of a median value of gate spacings between adjacent instances of said logic gate elements; and
said decoupling capacitor gate elements over said n+/p opening are not directly electrically connected to said capacitor gate elements over said p+/n opening;
forming a plurality of NSD regions in said substrate in said open areas in said field oxide in said p-well, said NSD regions including a plurality of n+ plates formed in said n+/p opening, such that n+/p junction capacitor elements exist at a boundary between said n+ plates and said p-well;
forming a plurality of PSD regions in said substrate in said open areas in said field oxide in said n-well, said PSD regions including a plurality of p+ plates formed in said p+/n opening, such that p+/n junction capacitor elements exist at a boundary between said p+ plates and said n-well;
forming a PMD layer over said field oxide, said gate elements, said NSD regions and said PSD regions;
forming a plurality of contacts in said PMD layer, so that said contacts make electrical connection to said gate elements, said NSD regions and said PSD regions;
forming a plurality of metal interconnects over said PMD layer, said metal interconnects making electrical connection to said contacts, said metal interconnects including:
logic gate interconnects formed in said area for said logic gates;
a Vdd bus, such that said Vdd bus extends into said area for said logic-cell-compatible decoupling capacitor and into said area for said logic gates;

a Vss bus, such that said Vss bus extends into said area for said logic-cell-compatible decoupling capacitor and into said area for said logic gates;

an n+/p capacitor bus formed in said area for said logic-cell-compatible decoupling capacitor, such that said n+/p capacitor bus makes electrical connection to said contacts making electrical connection to said n+ plates; and a p+/n capacitor bus formed in said area for said logic-cell-compatible decoupling capacitor, such that said p+/n capacitor bus makes electrical connection to said contacts making electrical connection to said p+ plates;

forming a Vdd resistor connecting said Vdd bus to said n+/p capacitor bus, said Vdd resistor containing at least two instances of said contacts and at least one element of electrically conductive material which is different from said metal interconnects; and forming a Vss resistor connecting said Vss bus to said p+/n capacitor bus, said Vss resistor containing at least two instances of said contacts and at least one element of electrically conductive material which is different from said metal interconnects.

12. The process of claim 11, in which at least one instance of said logic gate elements is within 1 micron of an instance of said decoupling capacitor gate elements.

13. The process of claim 11, in which an average area density of said metal interconnects in said area for said logic-cell-compatible decoupling capacitor is between 50 percent and 200 percent of an average area density of said metal interconnects in said area containing logic gates.

14. The process of claim 12, in which at least a portion of said decoupling capacitor gate elements are floated.

15. The process of claim 12, in which:
at least a portion of said decoupling capacitor gate elements located over said p+/n opening are connected to said p+/n capacitor bus; and
at least a portion of said decoupling capacitor gate elements located over said n+/p opening are connected to said n+/p capacitor bus.

16. The process of claim 15, in which an average area density of said metal interconnects in said area for said logic-cell-compatible decoupling capacitor is between 50 percent and 200 percent of an average area density of said metal interconnects in said area for the logic gates.

17. The process of claim 11, in which at least one of said Vdd resistor and said Vss resistor includes at least one active area resistor leg.

18. The process of claim 11, in which at least one of said Vdd resistor and said Vss resistor includes at least one gate material resistor leg.

19. The process of claim 11, in which at least one of said Vdd resistor and said Vss resistor includes at least four instances of said contacts.

20. The process of claim 11, in which at least one of said Vdd resistor and said Vss resistor includes a serpentine gate material element.

* * * * *